United States Patent [19]
Hirabayashi et al.

[11] Patent Number: 5,345,098
[45] Date of Patent: Sep. 6, 1994

[54] MASTER SLICE INTEGRATED CIRCUIT DEVICE

[75] Inventors: Yasuhisa Hirabayashi; Takashi Sakuda; Kazuhiko Okawa, all of Nagano; Yasuhiro Oguchi, Suwa, all of Japan

[73] Assignee: Seiko Epson Corporation, Tokyo, Japan

[21] Appl. No.: 878,527

[22] Filed: May 5, 1992

Related U.S. Application Data

[63] Continuation of Ser. No. 580,061, Sep. 10, 1990, Pat. No. 5,153,698.

[30] Foreign Application Priority Data

Sep. 8, 1989 [JP] Japan ................................. 1-233326
Jun. 25, 1990 [JP] Japan ................................. 2-166115

[51] Int. Cl.$^5$ ...................... H01L 27/10; H01L 27/15
[52] U.S. Cl. .................................. 257/207; 257/210
[58] Field of Search .................... 257/203, 207, 210

[56] References Cited

U.S. PATENT DOCUMENTS 4,748,494  5/1988  Yamada et al. ................... 257/207
4,811,073  3/1989  Kitamura et al. ................. 357/45

FOREIGN PATENT DOCUMENTS 0073641  3/1983  European Pat. Off. .
0074805  3/1983  European Pat. Off. .

Primary Examiner—Sara W. Crane
Attorney, Agent, or Firm—Spensley Horn Jubas & Lubitz

[57] ABSTRACT

In a master slice integrated circuit device composed of an array of internal cells having contact members, an array of external cells having contact members and formed outwardly from the internal cell array, a main power circuit region formed on the external cell array, a plurality of power lines formed on the internal array region, and a plurality of signal lines for electrically interconnecting selected contact members of the internal and external cells, intermediate power line connection regions are provided to conductively connect each power line to the main power circuit region, the intermediate connection regions including, for each power line, a power branch-off member disposed at a given position on the main power circuit region and extending substantially in the direction of its respective power line, and a connection allowance member intersecting, and connected to, the power branch-off member and having a predetermined length, the connection allowance member being conductively connected between its associated power branch-off member and the respective power line.

10 Claims, 6 Drawing Sheets

MASTER SLICE INTEGRATED CIRCUIT DEVICE

BACKGROUND OF THE INVENTION

This is a continuation of application Ser. No. 07/580,061, filed on Sep. 10, 1990 now U.S. Pat. No. 5,153,698.

FIELD OF THE INVENTION

This invention relates to a master slice integrated circuit device such as a gate array and more particularly to such a device characterized by the method used for providing power supply circuitry between a main power supply line at the periphery of the chip and the internal cell region of the chip.

Master slice type gate arrays can be readily fabricated so as to provide the particular logic circuitry desired by the customer. In this type of gate array, internal cells each comprising one or more transistors of prescribed types are formed in an orderly arrangement on a wafer and external cells (I/O buffers) are formed at a peripheral region of the wafer. The desired logic circuitry is thereafter obtained by selecting the appropriate wiring process or wiring pattern. In gate arrays of this type, the power lines which branch off from the main power line region formed on the external cell array region and pass into the internal cell array region are generally formed to be located at predetermined intervals with respect to the regularly arranged internal cells.

As seen in FIG. 5, a conventional gate array comprises a plurality of rows of internal cells C ($C_{mn}$ . . . $C_{m+5\ n+2}$) and external cells 20 ($20_m$ . . . $20_{m+3}$) disposed vertically at an internal region of the chip. Each external cell C is constituted of one or more transistors, and internal and external wiring is provided via prescribed contacts (not shown) for interconnecting the internal cells themselves. As a result the vertical pitch $P_{IN}$ of the internal cells C depends on the type of the internal cells and the number of transistors therein. On the other hand, the pitch $P_{OUT}$ of the external cells 20 is ordinarily matched to the pitch of pads (not shown) formed exterior of the array. In the case of a master slice, a certain amount of fixed wiring is provided for interconnecting the transistors and the like into fixed devices in advance. Later the final wiring (signal and power lines) is provided for interconnecting the devices formed in advance so as to obtain the particular logic circuitry required by the customer. This final wiring is carried out by making up appropriate wiring patterns (pattern versions), fixing the original and inputting the pattern version to a wiring processing means, such as a computer.

The gate array shown in FIG. 5 has a main power line region 30 formed on the region of the external cells 20 and power lines 1 (. . . $1_m$, $1_{m+1}$, $1_{m+2}$ . . . ) are provided to branch off from the power line region 30 and each supplies power to two rows adjacent of the internal cell array. As will be noted in FIG. 5, the array constituted of the internal cells C and the array constituted of the external cells 20 are out of phase as regards their repetition periods. More specifically, the relationship between the pitch $P_{OUT}$ of the external cells and the pitch $P_{IN}$ of the internal cells can be expressed as $$j\ P_{OUT} \neq k\ P_{IN} \qquad (1)$$

$$k > j \geq 1 \qquad (2)$$

where j and k are any positive integers. When the pitch of the positions at which lines 1 (. . . $1_m$, $1_{m+1}$, $1_{m+2}$ . . . ) branch off from the main power line region 30 is set to match the pitch $P_{OUT}$ of the external cells 20 (e.g. when in FIG. 5 these lines are disposed at the boundary positions . . . $P_m$, $P_{m+1}$, $P_{m+2}$ . . . ) and the lines are patterned to then extend between adjacent rows of cells C, the periods of repetition of the internal cells C and the external cells 20 in the vertical direction will be out of the phase with one another. Therefore, as can be seen in FIG. 5, each of the power lines 1 (. . . $1_m$, $1_{m+1}$, $1_{m+2}$ . . . ) has a respectively different pattern, or configuration, so that the number of power line pattern, versions is equal to the number of power lines.

For ensuring the voltage stability and the like of the power supplied to the individual internal cells, the delivery of power to these cells is effected by a method wherein the power lines shown in FIG. 5 are disposed in an orderly fashion so as each to fall at the boundary region between two adjacent rows of the internal cell array. On the other hand, the branch-off positions of the power lines are disposed at the fixed positions $P_m$, $P_{m+1}$, $P_{m+2}$ so that they will fall in a fixed positional relationship to the external cells ($20_m$ . . . $20_{m+3}$) corresponding to contact window positions ($X_{m+1}$, $Y_{m+1}$), ($X_{m+2}$, $Y_{m+2}$), ($X_{m+3}$, $Y_{m+3}$) of the external cells $20_{m+1}$, $20_{m+2}$, $20_{m+3}$ whereby there can be obtained a single and commonly usable branch-off pattern.

FIG. 6 shows the wiring pattern of another gate array having a main power line region 30. In this array, signal pads 5 (. . . $5_L$, . . . $5_{L+5}$ . . . ) are connected with external cells 7 ( . . . $7_L$, . . . $7_{L+5}$ . . . ). The external cells 7 are connected with contact windows X ($X_a$, $X_b$ . . . $X_e$ . . . ) via lead lines a–e ($a_L$ . . . $e_{L+5}$). Power lines 9 are formed on the array region of the internal cells 11 so as to be spaced at the pitch $P_{IN}$ of the internal cells 11 of the array. Main power line region 30 is formed on the region of the external cells 7. The pitch of the branch-off positions of the power lines 9 from the main power line region is the same as the pitch $P_{IN}$ of the internal cells. In this case, the spacing intervals of the array of internal cells 11 and the array of external cells are in phase. More specifically, the relationship between the pitch $P_{OUT}$ of the external cells and the pitch $P_{IN}$ of the internal cells can be expressed as $$j\ P_{OUT} = k\ P_{IN} \qquad (3)$$

$$k > j \geq 1 \qquad (2)$$

where j and k are positive integers.

In this case under consideration, j=4 and k=7 so that the lead lines (a–e) from every fourth external cell 7 have the same pattern. For example, the pattern of the lead lines of external cell $7_L$ and $7_{L+4}$ have the same pattern. Because of this, only four patten versions are required for fabricating external cells 7.

Nevertheless the wiring method of conventional gate arrays involves the following problems.

1) In the case where as shown in FIG. 5, the periods of repetition of the external cells 20 and the internal cells C are out of phase, every power line 1 has a different pattern. Moreover, the branch-off portions of the power lines may, depending on their configuration, constitute a hindrance to the provision of the contact windows at the prescribed position, whereby differences may arise between the position of the contact windows between external cells of the same logic type. The result is that differences arise in the patterns of the lead lines from the external cells. As a consequence, there is an increase in the number of power line pattern versions and also, in some cases, in the number of lead line pattern versions. This makes automatic wiring difficult.

2) In the case where, as shown in FIG. 6 the periods of repetition of the external cells 7 and the internal cells 11 are in phase, the patterns of all power lines 9 are identical and the number of lead line patterns can be limited to the value of j in equation (3) so that it would appear that the number of pattern versions for the power lines and the lead lines is much smaller than in the case of the out-of-phase arrangement of FIG. 5. However, the contact window patterns are not all the same with respect to the external cells 7. Namely, the number of such patterns is equal to j. Therefore, since the contact windows of the external cells are not all formed in the same fixed position, the actual work of providing the signal lines for connecting the contact windows of the external cells with the contact windows of the internal cells (not shown) is made even more complicated.

On the other hand, arrangement of the external and internal cells in an in-phase relationship diminishes the degree of freedom regarding such basic design factors as the circuitry and size of both types of cells. More specifically, since cell size cannot be freely selected, there is no choice but to fix discrete cell sizes, a necessity which automatically puts a major limitation on the size or the circuitry which can be fitted into each cell.

SUMMARY OF THE INVENTION

One object of this invention is to overcame the aforesaid problems by providing a master slice integrated circuit device wherein the pattern of the power lines at the region where they branch off from the main power line region is so improved that, irrespective of whether the periods of repetition of the external and internal cells are in or out of phase, the total number of power line and lead line patterns can be reduced without loss of freedom in selecting the size and circuitry of the individual cells and without hindering the actual process for forming the signal and power lines between the contact windows of the external cells and the internal cells.

For achieving this object the invention provides a master slice integrated circuit device comprising an internal cell array and an external cell array formed outwardly from the internal cell array, a main power line region provided on the external cell arrays, a plurality of power lines in electrical continuity with the main power line region and formed at selected intervals on the internal array region, and a plurality of signal lines for electrically interconnecting prescribed contact numbers of the internal and external cells for thereby realizing a desired logic circuit. What characterizes the master slice integrated circuit device according to the present invention is the additional provision of intermediate connection means at the connection regions between the main power line region and the power lines. Each of the intermediate connections means comprises a fixed position branch-off portion extending over a prescribed length in the direction of the associated power line from a position on the main power line region coinciding with a specific position on the associated external cell and an intersecting connection allowance portion of prescribed length connected with the fixed position branch-off portion and disposed to be perpendicular to and connect with the power line. The intermediate connection means can, for instance, have a substantially T- or L-shaped configuration. The plurality of parallel disposed power lines need not necessarily be provided one per row of the internal cells and may alternatively be provided one per every two rows of the internal cells, in which case they are provided along the boundaries between adjacent cell row pairs. Moreover, it does not matter whether the periods of repetition of the external and internal cells are in or out of phase.

When such intermediate connection means are employed in the formation of the wiring pattern, it becomes possible to standardize the lead pattern of the external cells beneath the main power line region as well as to fix the position of the contact members of the external cells. In other words, irrespective of the circuitry or size of the external cells, each fixed position branch-off portion extends by a prescribed length in the direction of the associated power line from a position on the main power line region coinciding with a specified position on the associated external cell. Moreover, it is connected with the intersecting connection allowance portion extending perpendicularly thereto. Therefore, since the intermediate circuit regions do not interfere with the provision of the contact members of the external cells, these contact members can be provided in fixed positions. As a result, the patterns of the circuits within the external cells and of the lead lines connecting with the contact members of the external cells are the same for all of the external cells.

On the other hand, it is advantageous from, for example, the point of ensuring the stability of the voltage of the power supplied to the internal cells to dispose the power lines on the internal cell array region at a constant pitch. In accordance with the present invention, the power lines are not connected directly with the main power line region but are connected with the intersecting connection allowance portions of the intermediate connection means so that any offset between the power lines and the external cells that arises because the power lines are provided at a constant pitch on the internal cell array region will be absorbed by the intersecting connection allowance portions which have adequate length for this purpose. Thus no need arises for taking into account the connection pattern between the power lines and the main power line circuit region. A single pattern version for the power lines thus suffices. Therefore, in the process for forming the wiring pattern, this is possible by adopting a substantially T- or L-shaped pattern for the lead lines of all external cells and a common pattern for the lead lines.

The foregoing discussion is based on the assumption that the periods of repetition of the external and internal cells are out of phase. However, even in the case where they are in phase, it has conventionally been impossible to use a uniform pattern for the lead lines of all of the external cells. In accordance with this invention, however, it is possible to use a single, common pattern for the lead lines irrespective of whether the periods of repetition are in or out of phase. The advantage of being able to use a common pattern is that since it is not assumed that the periods of repetition of the external and internal cells are in phase, there arises no limitation on the circuitry or the size of the internal cells, whereby freedom in designing the cell functions is assured. Moreover, the positions of the contact members of the external cells can be made the same among all external cells and this facilitates the adoption of a common pattern for signal lines to be connected between the contact members of the external cells and those of the internal cells.

The above and other features of the present invention will become apparent from the following description made with reference to the drawings.

DETAILED DESCRIPTION OF THE PREFERRED EMBODIMENTS

The present invention now be explained in detail with reference to the attached drawings.

Figure 5:
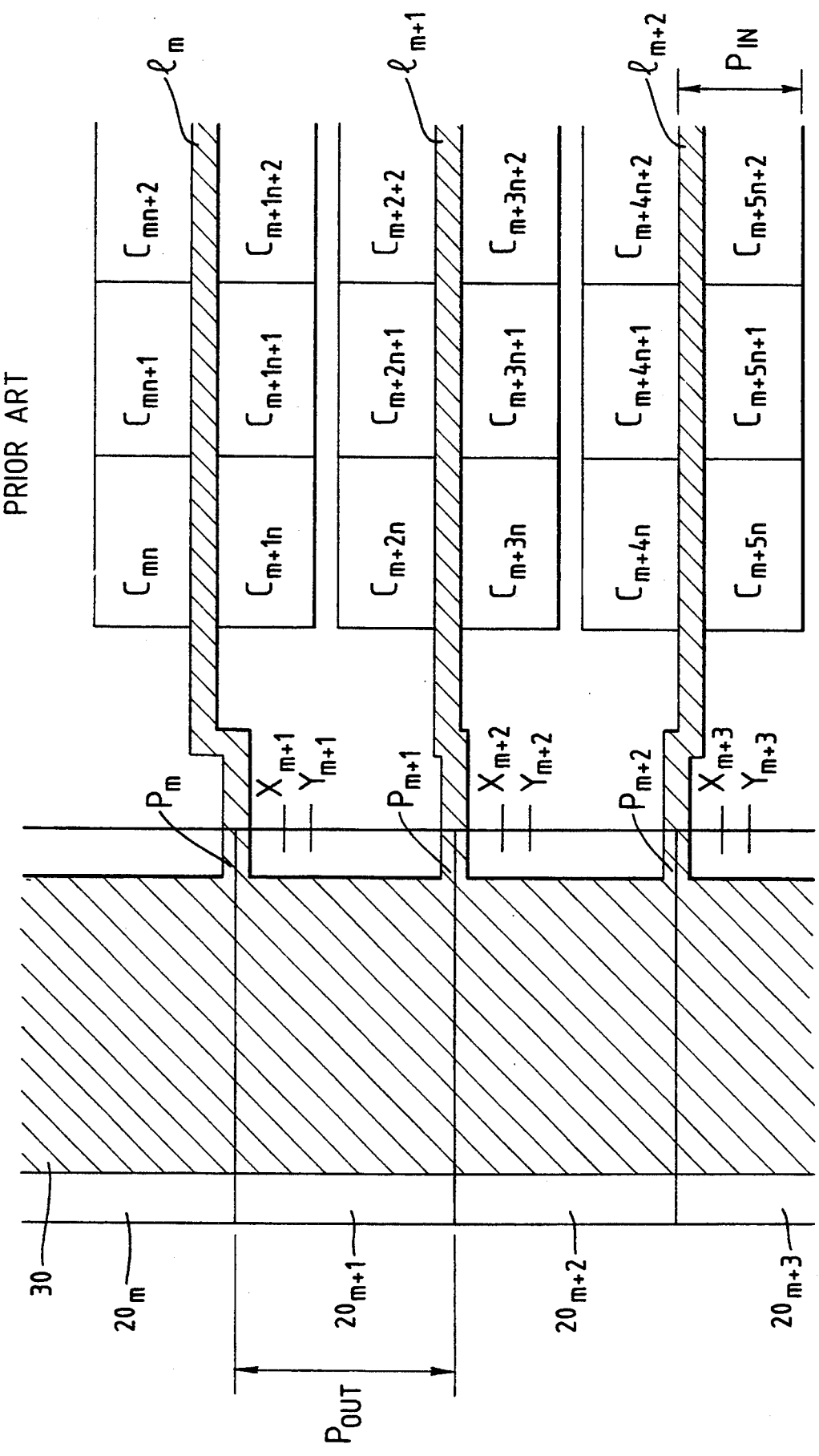
FIG. 5 is a partial plan view of the wiring pattern of a conventional gate array.
Figure 6:
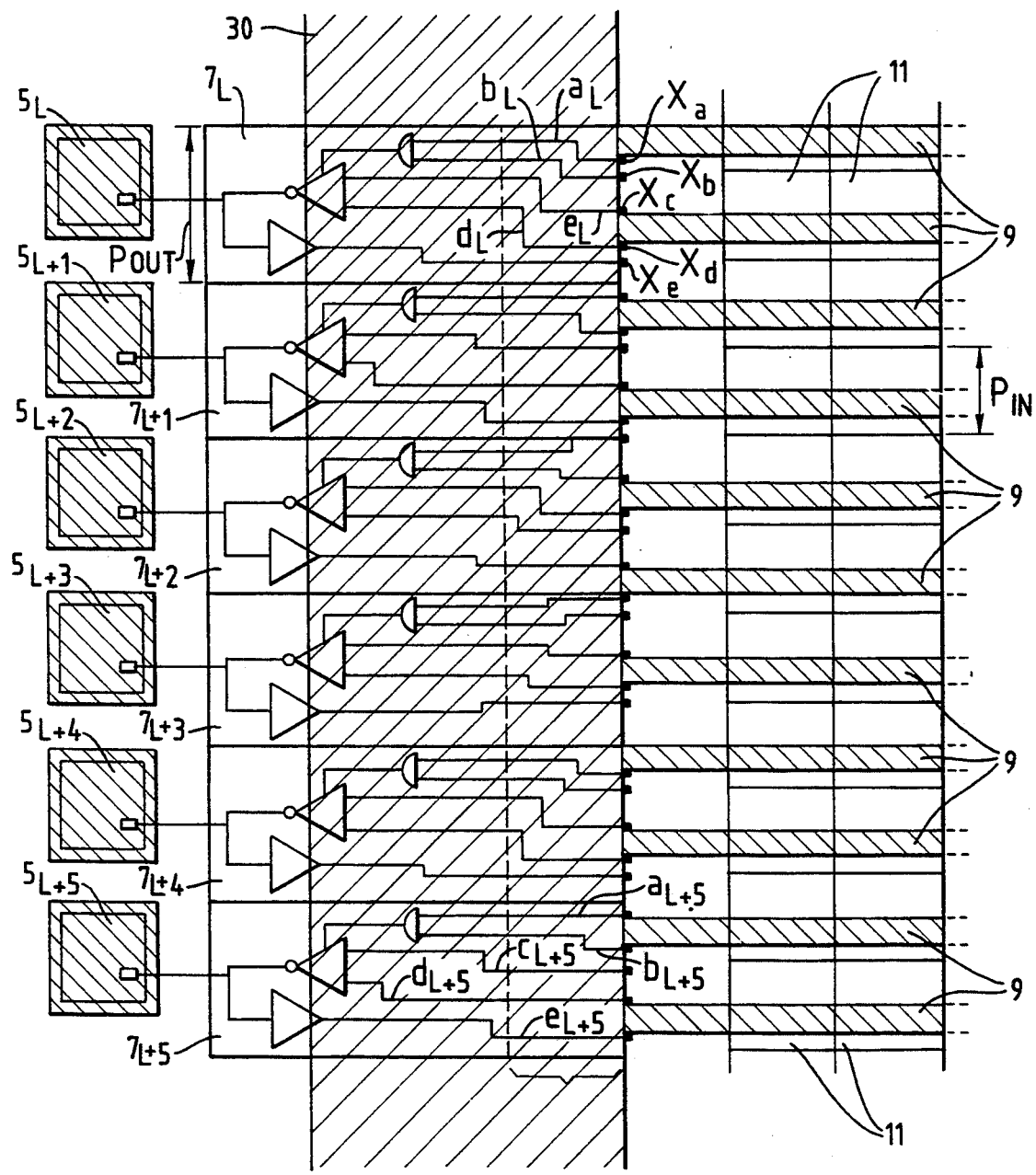
FIG. 6 is a partial plan view of the wiring pattern of another conventional gate array.

In the gate array according to a first embodiment of this invention shown in FIG. 1 those numbers corresponding to numbers in the conventional arrangement shown in FIG. 5 are assigned the same reference symbols as those in FIG. 5 and no further explanation will be made with respect thereto.

Figure 1:
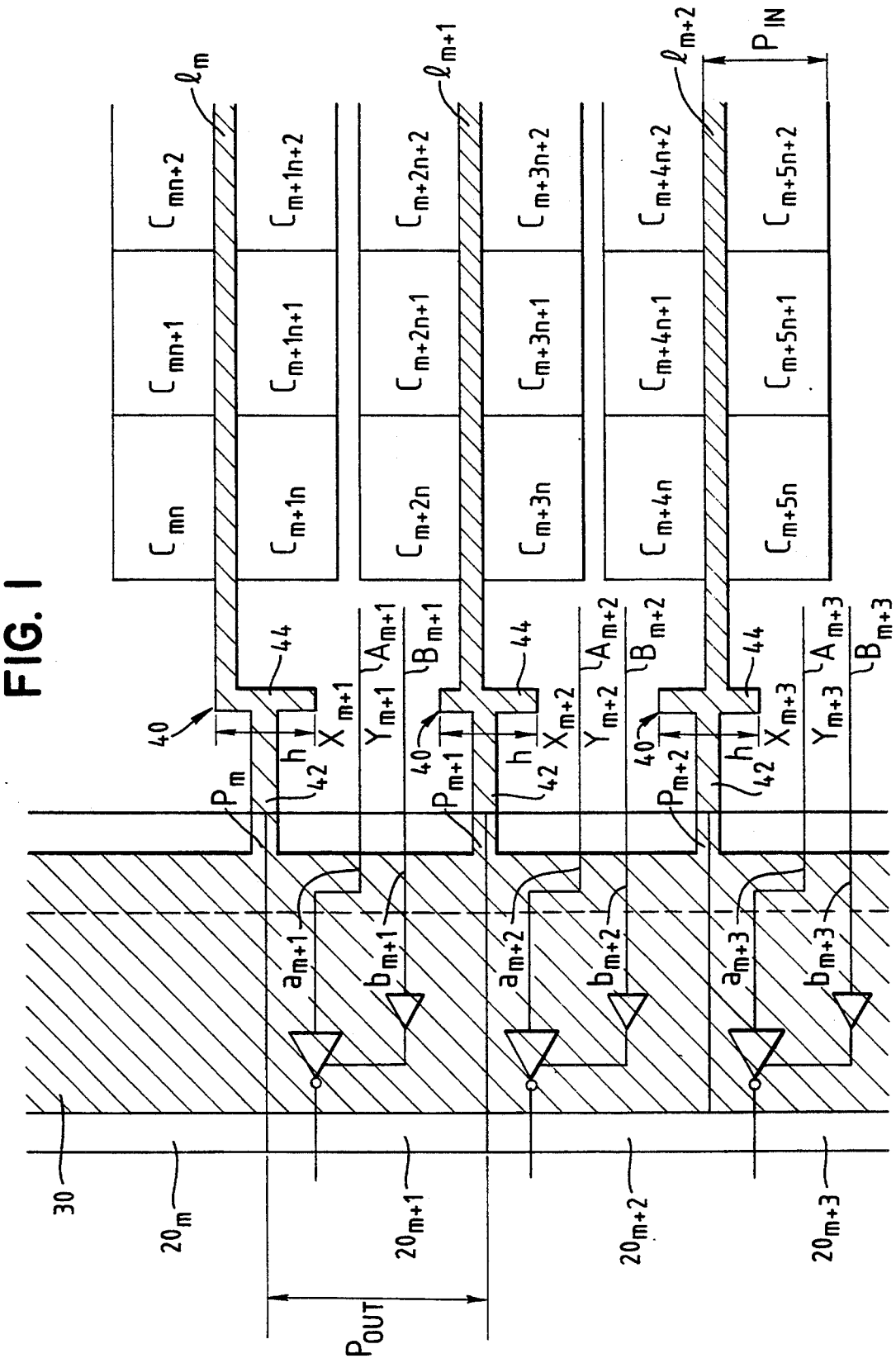
FIG. 1 is a partial plan view of the wiring pattern of a gate array in accordance with a first embodiment of the invention.

The gate array illustrated in FIG. 1 comprises a plurality of internal cells C formed in orderly horizontal rows and vertical columns at an inner region of the chip and external cells 20 formed at an outer region of the chip in a vertical row along the periphery of the internal cells C. The pitch $P_{IN}$ of the internal cells is smaller than the pitch $P_{OUT}$ of the external cells 20. In the arrangement shown in FIG. 1, $P_{IN}$ is slightly greater than $P_{OUT}/2$.

The main power line region 30 is formed on the external cell 20 region and electric power is supplied to the internal cell array by power lines 1 ($l_m$, $l_{m+1}$, $l_{m+2}$) provided at a pitch of one power line 1 per every two rows of the internal cells C (at a pitch of 2 $P_{IN}$). Further, lead lines ($a_{m+1}$, $a_{m+2}$, ...) and b ($b_{m+1}$, $b_{m+2}$, ...) of external cells 20 are connected to signal lines A ($A_{m+1}$, $A_{m+2}$, ...) and B ($B_{m+1}$, $B_{m+2}$, ...) via contact windows X ($X_{m+1}$, $X_{m+2}$...) and Y ($Y_{m+1}$, $Y_{m+2}$, ...). In this embodiment, the periods of repetition of the internal array constituted by the internal cells C and the external array constituted by the external cells 20 are out of phase. Therefore the relationship between the pitch $P_{OUT}$ of the external cells and the pitch $P_{IN}$ of the internal cells in the chip is $$j\, P_{OUT} \neq k\, P_{IN} \quad (1)$$

$$k > j \geq 1 \quad (2)$$

where j and k are positive integers.

Each of the power lines 1, which extends along a straight horizontal line, is electrically connected with the main power line region 30 via an intermediate connection means 40. The intermediate connection means 40 are here constituted as T-shaped members and each T-shaped member is composed of a fixed position branch-off portion 42 and an intersecting connection allowance portion 44. The fixed position branch-off portions 42 extend substantially in the direction of the power lines 1 by a prescribed distance from positions on the intermediate connection means 40 coinciding with positions (... $P_m$, $P_{m+1}$, $P_{m+2}$ ...) between pairs of adjacent external cells 20, while the intersecting connection allowance portions 44 are each connected with the inner end of a respective fixed position branch-off portion 42 so as to extend in a direction substantially perpendicular to the power lines 1. The intersecting connection allowance portions 44 have such length as to enable each of them to intersect with at least one of the power lines 1. More specifically, in the present embodiment the power lines 1 are disposed at a pitch of one power line 1 per every two rows of the internal cells C (at a pitch of 2 $P_{IN}$) and the pitch $P_{OUT}$ of the external cells is greater than the pitch $P_{IN}$ of the internal cells so that the length h of the intersecting connection allowance portions 44 and the $P_{IN}$ of the internal cells c must satisfy the relationship $$h \geq P_{IN} \quad (4)$$

It should be noted, however, that if the length h of each portion 44 should be made too great, the intersecting connection allowance portions 44 will interfere with their disposition on the same layer as that of signal lines A, B from the contact window positions ($X_{m+1}$, $Y_{m+1}$), ($X_{m+2}$ $Y_{m+2}$), ($X_{m+3}$, $Y_{m+3}$) of the external cells $20_{m+1}$, $20_{m+2}$, $20_{m+3}$. Therefore, the following relationship is established $$h = P_{IN} \quad (5)$$

As a consequence, the interval, or free space, between adjacent intersecting connection allowance portions 44, 44 becomes $P_{OUT} - P_{IN}$.

The contact window positions ($X_{m+1}$, $Y_{m+1}$), ($X_{m+2}$, $Y_{m+2}$), ($X_{m+3}$, $Y_{m+3}$) can be fixed. This is because the positions of the fixed position branch-off portions 42 are selected with respect to the external cells 20 so as to enable the contact window positions to be fixed. Namely, the position of the fixed position branch-off portions 42 is selected so as not to be a hindrance. Further, it is preferable to make the length of the fixed position branch-off portions 42 greater than the size of the contact windows. While the positions (... $P_m$, $P_{m+1}$, $P_{m+2}$ ...) of the fixed position branch-off portions 42 are at the boundaries between adjacent external cells 20 in the gate array shown in FIG. 1, other positions can be selected in accordance with the circuitry of the external cells. Further, for facilitating the connection between lead lines a, b of external cells 20 and signal lines A, B of internal cells C within the same layer as the power circuitry layer, the contact window positions (only two shown, as X and Y, in FIG. 1) are made to fall at the center of the external cells 20 so that the signal lines A, B can be readily led out.

The advantage of fixing the positions of the contact windows is that it enables standardization of the lead pattern a, b between the respective external cells 20 and the associated contact windows. In other words, one aspect of which the presence of the intermediate connection means 40 which is significant is that by uniformly providing the fixed position branch-off portions 42 to extend from the main power line region 30 by a prescribed length, it becomes possible to standardize the positions of the contact windows, which in turn makes the pattern of the external cell leads uniform. In the process for wiring formation, therefore, although it becomes necessary to form one additional pattern member (the intermediate connection means 40), it suffices to use only one pattern for the lead lines.

Figure 2:
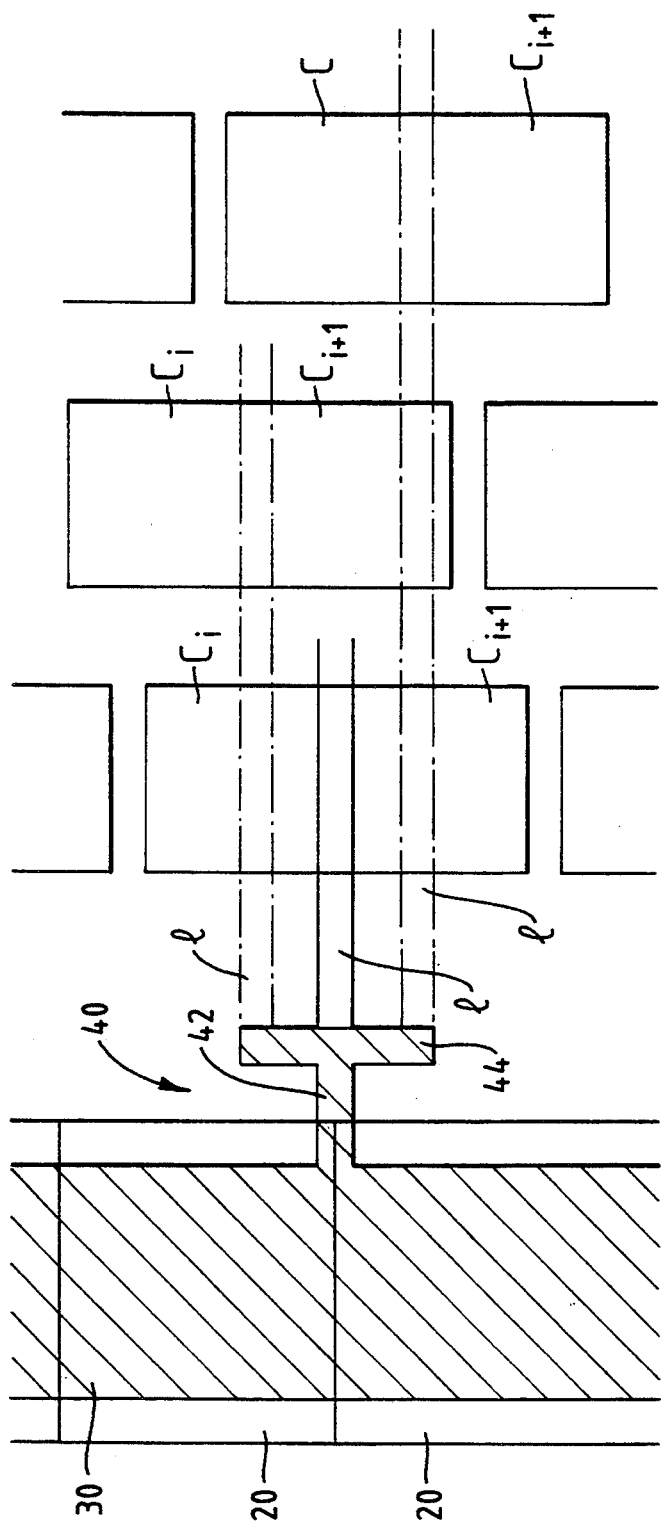
FIG. 2 is a schematic view showing different power line formation modes in the embodiment of FIG. 1.

As regards the formation of the power lines 1 on the other hand, it again suffices to use only a single pattern version. This is because, as can be seen from the schematic view of FIG. 2, for ensuring that the tips of the respective power lines 1 will connect with the associated connection allowance portions 44, it is only necessary either to dispose the power lines 1 at prescribed pitches or to dispose them between adjacent rows of internal cells $C_i$, $C_{i+1}$ at a pitch of 2 $P_{IN}$. It will be understood that the three power lines 1 shown in FIG. 2 will be located at different vertical positions in the device.

While the location of interconnection between each fixed position branch-off portion 42 and the associated intersecting connection allowance portion 44 falls at the mid-section of the intersecting connection allowance portion 44, the location of interconnection between each intersecting connection allowance portion 44 and the associated power line 1 varies from one power line to the next. However, this variation in the location of interconnection causes no problem in the automatic wiring process. This is because the substantial problems encountered in making up the wiring patterns relate to the complexity of the pattern versions and the number thereof, and variations in the connection locations between adjacent pattern versions are the result of the automatic wiring process. Therefore, standardization of the power lines greatly reduces the work load of the automatic wiring process.

It should be noted that the invention is not limited to the case where only a single power line is connected with each intersecting connection allowance portion 44 but also encompasses cases in which a plurality of power lines are connected with each portion 44.

Figure 3:
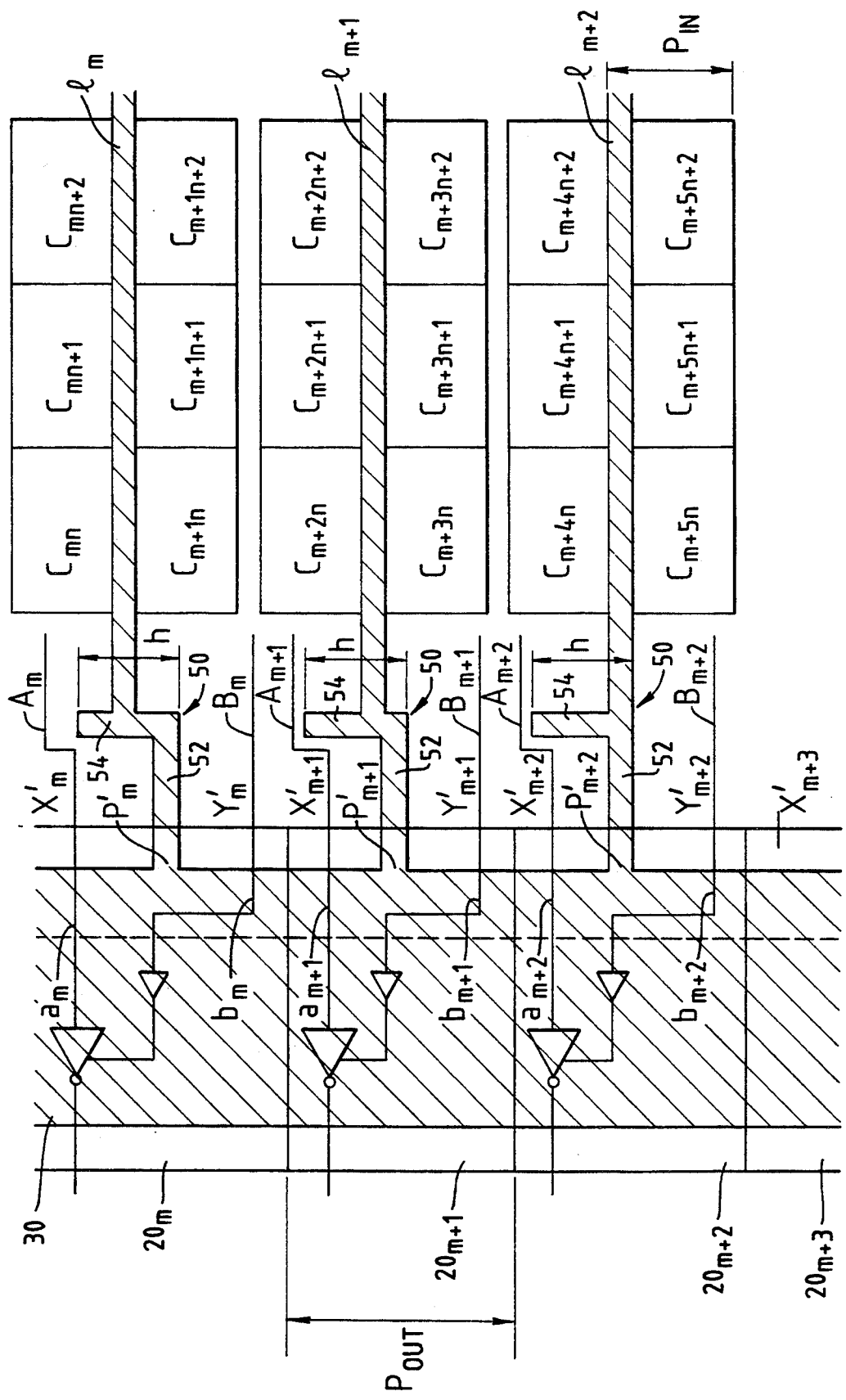
FIG. 3 is a partial view of the wiring pattern of a gate array in accordance with a second embodiment of the invention.

A gate array according to a second embodiment of the invention is shown in FIG. 3. Components similar to those in FIG. 1 are assigned the same reference characters and will not be explained again.

In this embodiment, the intermediate connection means 50 are of L-shaped configuration and are each constituted of a fixed position branch-off portion 52 of the same shape as the corresponding portion in the first embodiment and an intersecting connection allowance portion 54 one end of which is attached to the inner end of an associated portion 52. The fixed position branch-off portions 52 branch off from the main power line region 30 at positions coinciding with the center positions ($\ldots P'_m$, $P'_{m+1}$, $P'_{m+2} \ldots$) of the external cells 20. While the situation differs depending on the circuitry of the external cells, the purpose of this arrangement is to standardize the external cell signal contact window positions ($X'_{m+1}$, $Y'_{m+1}$), ($X'_{m+2}$, $Y'_{m+2}$), ($X'_{m+3}$, $Y'_{m+3}$) and to enable the lines B extending from the one set of contact window positions $Y'_{m+1}$, $Y'_{m+2}$, $Y'_{m+3}$ to the internal cell side to extend straight in the horizontal direction.

The intersecting connection allowance portions 54 are provided at the inner ends of the fixed position branch-off portions 52 to form hook-like configurations. The length h of each intersecting connection allowance portion 54 is the same as the pitch $P_{IN}$ of the internal cells C. While the intersecting connection allowance portions 54 interfere to some degree with the formation of straight signal A lines to extend from the other set of contact window positions $X'_{m+1}$, $X'_{m+2}$, $X'_{m+3}$ of the external cells to the internal cell side, it is possible by having them make a jog of a prescribed vertical magnitude to extend them to the internal cell side within the same layer as that in which the power lines are formed.

Figure 4:
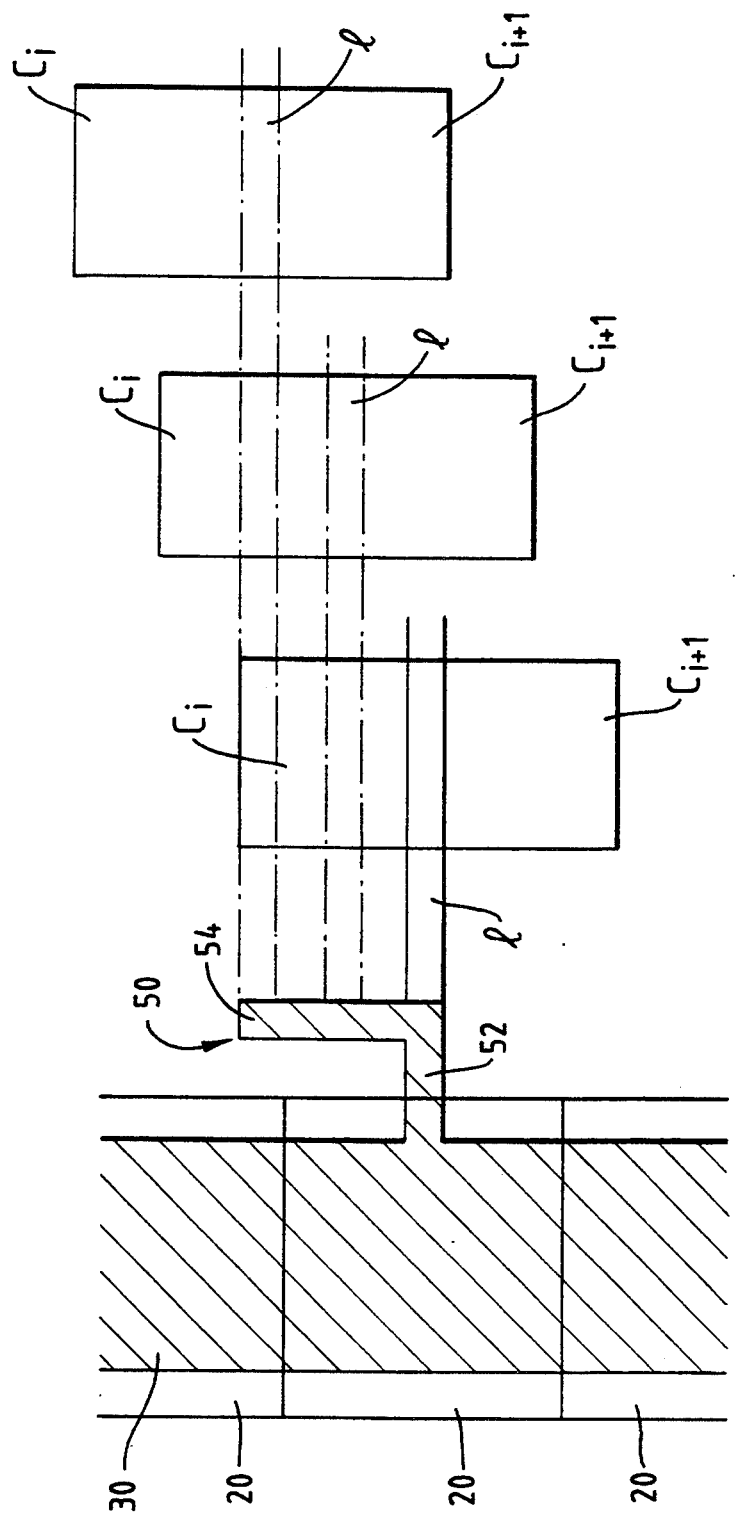
FIG. 4 is a schematic view showing different power line formation modes in the embodiment of FIG. 3.

In this embodiment, too, the standardizing of the signal contact window positions ($X'_{m+1}$, $Y'_{m+1}$), ($X'_{m+2}$, $Y'_{m+2}$), ($X'_{m+3}$, $Y'_{m+3}$) makes it possible to use a common lead line pattern. As can be seen from the schematic view of FIG. 4, for ensuring that the tips of the respective power lines 1 will connect with the associated intersecting connection allowance portions 54, it is only necessary to dispose the power lines 1 at prescribed pitches.

As is clear from the foregoing explanation, the present invention is characterized in that a master slice integrated circuit device such as a gate array, the period of repetition of the external and internal cells of which may or may not be in phase, is provided at prescribed intervals along its main power line region with intermediate connection means each consisting of a fixed position branch-off portion branching off from the main power circuit region and an intersecting connection allowance portion connected with the free end of the fixed position branch-off portion so as to lie transverse, and preferably perpendicular, thereto. As a result of this feature, the invention has the following effects:

1) As the presence of the fixed position branch-off portion enables the contact members of the external cells always to be disposed in a fixed position relative to the external cell concerned, the pattern of the lead lines with respect to external cells of the same logic type can be made uniform, whereby the number of pattern versions that need be prepared at the time of determining the wiring layout can be greatly reduced. As this reduction in the number of pattern versions also reduces the number of tables required for automatic wiring layout, the program therefor becomes simpler and, as a result, the overall reliability of the system is improved.

2) The presence of the intersecting connection allowance portion makes it possible too use only a single power line pattern version. As this also provides the effect mentioned in 1) above, the presence of the uniform intermediate circuit regions has a synergistic effect toward reducing the required number of pattern versions.

3) As the aforesaid benefits can be realized even when the repetition periods of the internal and external cells are out of phase, there are no limitations on the circuitry, size or other basic design factors of the external and internal cells. This means that in the design of the cell circuitry it is unnecessary to take into account the conditions to which the wiring pattern design to be conducted thereafter will be subject. This is highly significant from the point of ease in carrying out step-by-step design of a gate array or other such device.

This application relates to subject matter disclosed in Japanese Application no. 233326/89, filed on Sep. 8, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. In a master slice integrated circuit device comprising an array of internal cells having contact members, an array of external cells having contact members and formed outwardly from the internal cell array, a plurality of power lines formed on the internal array region, means for delivering power to the power lines, and a plurality of signal lines for electrically interconnecting selected contact members of the internal and external cells, the improvement comprising intermediate power line connection means conductively connecting each said power line to said means for delivering power, said intermediate connection means comprising, for each said power line, a power branch-off member disposed at a given position on said means for delivering power and extending substantially in the direction of its respective power line, and a connection allowance member intersecting, and connected to, said power branch-off member and having a predetermined length, so that said connection allowance members for all of said power lines all have substantially the same length, said connection allowance member for each said power line being conductively connected between its associated power branch-off member and the respective power line, and said connection allowance member being connected to only one power line.

2. A master slice integrated circuit device according to claim 1 wherein said power branch-off member and said connection allowance member for each said power line together form a substantially T-shaped structure.

3. A master slice integrated circuit device according to claim 1 wherein said power branch-off member and said connection allowance member for each said power line together form a substantially L-shaped structure.

4. A master slice integrated circuit device according to claim 1 wherein each of said power lines is formed along a boundary formed between an adjacent pair of the internal cells.

5. A master slice integrated circuit device according to claim 1 wherein said external cells are equispaced from one another by a first spacing, $P_{OUT}$, and said internal cells are equispaced from one another by a second spacing, $P_{IN}$, where:

$$j\, P_{OUT} \neq k\, P_{IN}$$

$$k > j \geq 1$$

where j and k are positive integers.

6. A master slice integrated circuit device according to claim 1, wherein said external cells are equispaced from one another by a first spacing, $P_{OUT}$, said internal cells are equispaced from one another by a second spacing, $P_{IN}$, $P_{OUT} > P_{IN}$, and the predetermined length of each said connection allowance member is greater than or equal to $P_{IN}$.

7. A master slice integrated circuit device according to claim 2, wherein said external cells are equispaced from one another by a first spacing, $P_{OUT}$, said internal cells are equispaced from one another by a second spacing, $P_{IN}$, $P_{OUT} > P_{IN}$, and the predetermined length of each said connection allowance member is greater than or equal to $P_{IN}$.

8. A master slice integrated circuit device according to claim 3, wherein said external cells are equispaced from one another by a first spacing. $P_{OUT}$, said internal cells are equispaced from one another by a second spacing, $P_{IN}$, $P_{OUT} > P_{IN}$, and the predetermined length of each said connection allowance member is greater than or equal to $P_{IN}$.

9. A master slice integrated circuit device according to claim 4, wherein said external cells are equispaced from one another by a first spacing, $P_{OUT}$, said internal cells are equispaced from one another by a second spacing, $P_{IN}$, $P_{OUT} > P_{IN}$, and the predetermined length of each said connection allowance member is greater than or equal to $P_{IN}$.

10. A master slice integrated circuit device according to claim 5, wherein $P_{OUT} > P_{IN}$, and the predetermined length of each said connection allowance member is greater than or equal to $P_{IN}$.

* * * * *